United States Patent
Takashima et al.

(10) Patent No.: US 10,576,433 B2
(45) Date of Patent: *Mar. 3, 2020

(54) METHOD FOR PURIFYING LIQUID, METHOD FOR PRODUCING CHEMICAL SOLUTION OR CLEANING SOLUTION, FILTER MEDIUM, AND FILTER DEVICE

(71) Applicant: Tokyo Ohka Kogyo Co., Ltd., Kanagawa (JP)

(72) Inventors: Hayato Takashima, Kanagawa (JP); Takao Nakajima, Kanagawa (JP); Tsukasa Sugawara, Kanagawa (JP); Jun Koshiyama, Kanagawa (JP)

(73) Assignee: TOKYO OHKA KOGYO CO., LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/549,740

(22) PCT Filed: Feb. 22, 2016

(86) PCT No.: PCT/JP2016/055079
§ 371 (c)(1),
(2) Date: Aug. 9, 2017

(87) PCT Pub. No.: WO2016/136673
PCT Pub. Date: Sep. 1, 2016

(65) Prior Publication Data
US 2018/0028983 A1    Feb. 1, 2018

(30) Foreign Application Priority Data

Feb. 23, 2015 (JP) ................... 2015-033425
Feb. 3, 2016 (JP) ................... 2016-019176

(51) Int. Cl.
| | | |
|---|---|---|
| B01D 71/64 | (2006.01) | |
| B01D 61/14 | (2006.01) | |
| B01D 61/02 | (2006.01) | |
| B01D 69/02 | (2006.01) | |
| H01L 21/02 | (2006.01) | |

(52) U.S. Cl.
CPC ........... B01D 71/64 (2013.01); B01D 61/027 (2013.01); B01D 61/14 (2013.01); B01D 69/02 (2013.01); H01L 21/02041 (2013.01); B01D 2325/021 (2013.01); B01D 2325/30 (2013.01)

(58) Field of Classification Search
CPC .......... B01D 2325/021; B01D 2325/30; B01D 61/027; B01D 61/14; B01D 69/02; B01D 71/64; H01L 21/02041
See application file for complete search history.

(56) References Cited

U.S. PATENT DOCUMENTS

| 7,771,911 B2 | 8/2010 | Hada et al. |
|---|---|---|
| 2006/0014098 A1 | 1/2006 | Hada et al. |
| 2007/0209506 A1 | 9/2007 | Liu et al. |
| 2013/0045355 A1* | 2/2013 | Ohya ............... B01D 67/0006 428/116 |
| 2015/0246323 A1* | 9/2015 | Singh .................. B01D 69/06 210/650 |
| 2015/0367292 A1 | 12/2015 | Hashimoto et al. |
| 2016/0072110 A1 | 3/2016 | Sugawara et al. |

FOREIGN PATENT DOCUMENTS

| CN | 1911494 | 2/2007 |
|---|---|---|
| JP | 9-57069 | 3/1997 |
| JP | 4637476 | 2/2011 |
| JP | 2014-94501 | 5/2014 |
| TW | 200744957 | 12/2007 |
| TW | 201506059 | 2/2015 |
| WO | 2013/094528 | 6/2013 |
| WO | 2014/115687 | 7/2014 |
| WO | 2014/175011 | 10/2014 |

OTHER PUBLICATIONS

International Search Report dated Apr. 19, 2016 in International (PCT) Application No. PCT/JP2016/055079.
Office Action dated Sep. 13, 2018 in corresponding Korean Patent Application No. 10-2017-7022061.
Office Action issued in TW Patent Application No. 105105301, dated Aug. 19, 2019.
Office Action dated Nov. 11, 2019 in corresponding Chinese Patent Application No. 201680011538.X.

* cited by examiner

*Primary Examiner* — John Kim
(74) *Attorney, Agent, or Firm* — Wenderoth, Lind & Ponack, L.L.P.

(57) ABSTRACT

The present invention addresses the problem of providing: a method for purifying a liquid using a porous polyimide and/or polyamideimide membrane having excellent impurities (e.g., metals) removal performance which is preferably compatible with a flow rate, and also having an excellent stress, an excellent breaking elongation and the like; a method for producing a chemical solution or a cleaning solution employing the purification method; a filter medium comprising the porous membrane; and a filter device equipped with the porous membrane. A method for purifying a liquid, comprising causing a portion or the whole of the liquid to pass through a porous polyimide and/or polyamideimide membrane having communicated pores from one side of the membrane to the other side of the membrane by the action of a differential pressure between the two sides.

12 Claims, No Drawings

METHOD FOR PURIFYING LIQUID, METHOD FOR PRODUCING CHEMICAL SOLUTION OR CLEANING SOLUTION, FILTER MEDIUM, AND FILTER DEVICE

TECHNICAL FIELD

The present invention relates to: a method for purifying a liquid using a polyimide and/or polyamideimide porous membrane; a method for producing a chemical solution or a cleaning solution using the purifying method; a filter medium including the polyimide and/or polyamideimide porous membrane; and a filter device including the polyimide and/or polyamideimide porous membrane.

BACKGROUND ART

In relation to semiconductor devices, with the increasing demand for higher performance, higher functionality, and lower power consumption, circuit patterns have been increasingly miniaturized, leading to a significantly growing demand for removal of contaminant metals that would reduce the production yield. Therefore, it is preferable that contaminant metals such as iron or zinc are not contained in a chemical solution such as a protective film formation solution for imparting hydrophobicity to a substrate or a silicon wafer cleaning solution.

Such chemical solutions for use in the process of manufacturing semiconductor devices are cleaned beforehand to remove contaminant metals such as iron and zinc by way of a filter device or the like. The filter device ordinarily includes a filter medium with a porous membrane.

Since impurities such as metal ions are removed, porous membranes capable of removing minute substances such as nanoparticles are desirable. Nylon, polyethylene, polypropylene, PTFE, and the like are typically used as filter films capable of removing impurities from a chemical solution or a resin material for a semiconductor device or the like. For example, it is known that organic impurities can also be removed by way of a filter film of nylon or the like (for example, see Patent Document 1).

Patent Document 1: Japanese Patent No. 4637476

DISCLOSURE OF THE INVENTION

Problems to be Solved by the Invention

However, membranes made of nylon have problems such as having poor acid resistance, thus being difficult to be cleaned with an acid, and being difficult to remove impurities mixed in or adhered to the filter itself. Further, films made of polyethylene have a problem of a low removal rate of impurities such as iron and zinc that should be removed from the chemical solution used in the manufacturing process of semiconductor devices.

The porous membranes used in filter media are industrially required to be capable of treating at a certain flow rate. When the flow rate is increased, however, the capability of removing impurities such as metal tends to be lowered, making it difficult to strike a balance between the flow rate and the impurity removing capability. In the membranes made of polyethylene, there has also been a problem that when a flow rate is increased, the membranes can be broken. Further, filter media are industrially used in heavy rotation, and thus preferably have durability such as high stress resistance, high fracture elongation, etc.

The present invention has been made in view of the above circumstances, and it is an object of the present invention to provide: a method for purifying a liquid using a polyimide and/or polyamideimide porous membrane that has a high capability of removing impurities such as metals and preferably can strike a balance between the impurity removing capability and the flow rate; a method for producing a chemical solution or a cleaning solution using the method for such purification; a filter medium including the porous membrane; and a filter device including the porous membrane.

Means for Solving the Problems

The present inventors have completed the present invention by finding that a polyimide and/or polyamideimide porous membrane having interconnected pores has a high capability of removing impurities such as metal, without lowering the stress resistance, fracture elongation, etc. derived from the polyimide and/or polyamideimide at least by virtue of its porous structure and can maintain the impurity removing capability even when the flow rate is increased.

A first aspect of the present invention is a method for purifying a liquid, the method including: allowing part or all of the liquid to be passed thorough from one side to the other side of a polyimide and/or polyamideimide porous membrane having interconnected pores by way of a differential pressure.

A second aspect of the present invention is a method for producing a chemical solution or a cleaning solution by using the method for purifying a liquid according to the first aspect of the present invention.

A third aspect of the present invention is a filter medium including the polyimide and/or polyamideimide porous membrane used for the method for purifying a liquid according to the first aspect of the present invention.

A fourth aspect of the present invention is a filter device including the polyimide and/or polyamideimide porous membrane used for the method for purifying a liquid according to the first aspect of the present invention.

Effects of the Invention

The present invention can provide a method for purifying a liquid using a polyimide and/or polyamideimide porous membrane that has a high capability of removing metals and preferably can strike a balance between the high metal removing capability and the flow rate, a method for producing a chemical solution or a cleaning solution using the purifying method, a filter medium including the porous membrane, and a filter device including the porous membrane.

PREFERRED MODE FOR CARRYING OUT THE INVENTION

Embodiments of the present invention will be hereinafter described in further detail. However, it should be noted that the present invention shall not in the least be limited to the following embodiments, and can be implemented as appropriately modified within the scope of the object of the present invention. In the present specification, the description of, for example, "P and/or Q" as in "polyimide and/or polyamideimide" and the like, and also, the description of, for example, "P, Q and/or R" as in "carboxy group, salt-type carboxy group and/or —NH— bond" respectively refer to "at least one member selected from the group consisting of P and Q" and "at least one member selected from the group consisting of P, Q, and R". This applies to other description using "and/or". Here P, Q and R are arbitrary terms.

[Method for Purifying Liquid]

The method for purifying a liquid according to the first aspect of the present invention includes allowing part or all of the liquid to be passed from one side to the other side of a polyimide and/or polyamideimide porous membrane having interconnected pores by way of a differential pressure.

<Polyimide and/or Polyamideimide Porous Membrane>

The polyimide and/or polyamideimide porous membrane used in the method for purifying a liquid according to the present invention has interconnected pores. The interconnected pores may have individual pores that impart porosity to the polyimide and/or polyamideimide porous membrane (hereinafter they may be abbreviated simply to "pores"), and the pores are preferably those having a curved inner surface (to be described later), and are more preferably substantially spherical pores (to be described later). In the polyimide and/or polyamideimide porous membrane, it is preferable that portions formed by adjacent individual pores become interconnected pores, and the pores having an interconnected structure are ordinarily connected to one another to form a flow path for a liquid to be purified, as a whole. "Flow path" is ordinarily formed by continuity of individual "pores" and/or "interconnected pores". Individual pores can also be considered to be pores formed by removing individual fine particles present in a polyimide-based resin-fine particle composite membrane in a post process in a method for manufacturing a polyimide-based resin porous membrane (to be described later). Further, the interconnected pores can also be considered to be adjacent individual pores formed by removing fine particles in a post process in portions where individual fine particles present in a polyimide-based resin-fine particle composite membrane are in contact with one another.

The polyimide and/or polyamideimide porous membrane of the present invention preferably has interconnected pores that ensure flow paths for allowing a liquid to be passed through the porous membrane so that the interconnected pores open to an external surface of the porous membrane are interconnected inside the porous membrane and are also open to an external surface of the other side (backside) of the porous membrane. The presence of interconnected pores in the polyimide and/or polyamideimide of the present invention can be expressed, for example, by Gurley air permeability, and the Gurley air permeability may be, for example, 30 to 1000 sec.

The Gurley air permeability of the polyimide and/or polyamideimide porous membrane of the present invention may be, for example, 1000 sec or less, preferably 600 sec or less, still more preferably 500 sec or less, most preferably 300 sec or less. The lower the Gurley air permeability, the better the results. Thus, the lower limit of the Gurley air permeability is not determined, in particular. Preferably, however, from the viewpoint of efficiently performing treatment such as metal removal while maintaining the flow rate of a liquid passed through the polyimide and/or polyamideimide porous membrane, the Gurley air permeability is preferably, for example, 30 sec or more. When the Gurley air permeability is 1000 sec or less, the porosity is satisfactorily high and, thus, in the present invention, the effect of purifying the liquid can be enhanced.

The polyimide and/or polyamideimide porous membrane of the present invention preferably contains interconnected pores having a diameter of 1 to 200 nm. The diameter of the interconnected pores is preferably 3 to 180 nm, more preferably 5 to 150 nm, still more preferably 10 to 130 nm. The pore size of the interconnected pores is the diameter of the interconnected pores. One interconnected pore is ordinarily formed by two adjacent particles by a manufacturing method (to be described later). Accordingly, the diameter may be a diameter in a direction perpendicular to a longitudinal direction defined as a direction in which two pores constituting the interconnected pore are continued. Regarding the pore size of the interconnected pores, the broader the distribution of pore sizes of individual pores that impart porosity to the polyimide and/or polyamideimide porous membrane, the smaller the diameter of interconnected pores per se formed by adjacent individual pores tends to be. Further, from the viewpoint of reducing the pore size of the interconnected pores, the porosity of the porous membrane may be for example, approximately in the range of 60 to 90%, preferably 60 to 80%, more preferably 70%. Further, also when an imide bond ring-opening step (to be described later) is not carried out, the pore size of the interconnected pores tends to be reduced.

The polyimide and/or polyamideimide porous membrane of the present invention has interconnected pores and, thus, when a fluid is introduced into the porous membrane, the fluid can be passed through the inside of the porous membrane. The polyimide and/or polyamideimide porous membrane preferably internally has a flow path composed of interconnected pores in continuity which connect individual pores each having a curved inner surface. Accordingly, it is considered that the fluid can be passed through the inside of the porous membrane and, further, is passed through while contacting with the curved surface of the individual pores, leading to an increased area of contact with the inner surface of the pores that allow minute substances such as metal particles present in the fluid to be easily adsorbed on the pores in the porous membrane.

As described above, the polyimide and/or polyamideimide porous membrane of the present invention is a porous membrane containing pores having a curved inner surface, and, more preferably, most of (preferably substantially all of) the pores in the porous membrane have a curved inner surface. In the present specification, "having a curved inner surface" with respect to the pore means that at least the inner surface of pores forming porosity has a curved surface in at least part of the inner surface.

It is preferable that substantially all of at least the inner surfaces of the pores in the porous membrane of the present invention are curved surfaces. These pores may be referred to as "substantially spherical pores". In the present specification, the "substantially spherical pores" means the pores having an inner surface that forms a substantially spherical space. Preferably, the substantially spherical pores can also be considered to be pores formed when fine particles used in the method for producing a polyimide-based resin porous membrane (to be described later) is substantially spherical. In the present specification, the "substantially spherical" is a concept including a completely spherical form but is not always limited to the completely spherical form and is a concept including a substantially spherical form. In the present specification, the "substantially spherical" means that the sphericity defined by a value obtained by dividing the major axis of a particle by the minor axis of the particle is within 1±0.3. The substantially spherical pores of the polyimide and/or polyamideimide porous membrane of the present invention preferably have sphericity within 1±0.1, and more preferably within 1±0.05.

When the pores in the porous membrane have a curved inner surface, it can be considered that there is a possibility that, when a fluid is passed into the polyimide and/or polyamideimide porous membrane of the present invention, the fluid is satisfactorily penetrated into the inside of the porous in the porous membrane and thus can be brought into satisfactory contact with the inner surface of the pores and, in some cases, convection occurs along the curved inner surface. Thus, it can be considered that minute substances such as metal particles present in the fluid are likely to be adsorbed in the recesses that may exist on the pores or the inner surface of the pores in the porous membrane of the present invention. The substantially spherical pores may have additional recesses in the inner surface. The recesses may be formed by pores having a smaller diameter than substantially spherical spheres having openings in the inner surface.

The polyimide and/or polyamideimide porous membrane of the present invention may be, for example, a porous membrane having an average pore diameter of 100 to 2000 nm, and the average pore diameter is preferably 200 to 1000 nm, more preferably 300 to 900 nm. In the present specification, for the porous membrane subjected to chemical etching treatment (to be described later), the level of change in average size of the interconnected pores is determined by a porometer, and an actual average pore diameter is determined from the value. On the other hand, for the polyamideimide porous membrane not subjected to the chemical etching, the average pore diameter of the fine particles used in producing the porous membrane can be regarded as the average pore diameter.

Preferably, the polyimide and/or polyamideimide porous membrane of the present invention has a structure including substantially spherical pores that have an average diameter of 50 to 2000 nm and are mutually connected to one another. The average diameter of the substantially spherical pores is preferably 100 to 1000 nm, more preferably 200 to 800 nm. The average diameter of the substantially spherical pores may be determined by the same method as described above in connection with the average pore diameter in the porous membrane.

The polyimide and/or polyamideimide porous membrane of the present invention may be obtained as a porous membrane having a porosity of, for example, 50 to 90% by mass, preferably 55 to 80% by mass, as determined by a method to be described later.

The polyimide and/or polyamideimide porous membrane used in the method for purifying a liquid according to the present invention contains a resin and may be substantially composed only of a resin. Specifically, the resin content is 95% by mass or more, preferably 98% by mass or more, more preferably 99% by mass or more. Resins contained in the polyimide and/or polyamideimide porous membrane of the present invention are preferably polyimides and/or polyamideimides, more preferably polyimide-containing resins, and may be polyimide alone. In the present specification, the polyimide and/or polyamideimide may also be referred to as "polyimide-based resin".

The polyimide and/or polyamideimide contained in the polyimides and/or polyamideimide membrane (hereinafter it may be abbreviated to "polyimide-based resin porous membrane" or "porous membrane") contain at least one group selected from the group consisting of carboxy groups, salt-type carboxy groups, and —NH— bond. Preferably, the polyimide and/or polyamideimide have a carboxy group, a salt-type carboxy group and/or an —NH— bond at a position other than the main chain terminal of the polyimide and/or polyamideimide.

In the present specification, the "salt-type carboxy group" means a group formed by substituting a hydrogen atom in the carboxy group with a cation component. In the present specification, the "cation component" may be a cation itself that is in a completely ionized state itself, or a cation component that is ionically bonded to —COO⁻ and is in a state of virtually no charge, or alternatively may be a cationic constituent having a partial charge that is an intermediate state between both of them. In the case where the "cation component" is an M ion component of n-valent metal M, the cation itself is expressed by $M^{n+}$, and the cation component is expressed by "M" in "—COOM$_{1/n}$".

In the present invention, cations formed in ion dissociation of compounds described as compounds containing chemical etching solutions (to be described later) may be mentioned as the "cation component", and representative examples thereof include ion components or organic alkali ion components. For example, when the alkali metal ion component is a sodium ion component, the cation itself is sodium ion ($Na^+$); the cationic constituent is an element represented by "Na" in "—COONa"; and the cationic constituent having a partial charge is $Na^{\delta+}$. In the present invention, the cation component is not particularly limited, and any of inorganic components, organic components such as $NH_4^+$, $N(CH_3)_4^+$ and the like is possible. Examples of inorganic components include metal elements including alkali metals such as Li, Na, and K, alkaline earth metals including Mg and Ca. Organic components, particularly organic alkali ion components include $NH_4^+$, for example, quaternary ammonium cations represented by $NR_4^+$ wherein four R's may be the same or different and each represent an organic group. The organic group as above described R is preferably an alkyl group, more preferably an alkyl group having 1 to 6 carbon atoms. Examples of quaternary ammonium cations include $N(CH_3)_4^+$ and the like.

In the present invention, the state of the "salt-type carboxy group" and "cation component" is not particularly limited and may depend upon an environment where the polyimide and/or the polyamideimide exists, for example, may be in an aqueous solution, in an organic solvent, in dried state, or the like. When the cation component is a sodium ion component, for example, in an aqueous solution, there is a possibility that the component is dissociated into —COO⁻ and $Na^+$, while, in an organic solvent or in a dried state, there is a high possibility that the component is not dissociated.

The polyimide and/or polyamideimide of the present invention may have at least one group selected from the group consisting of carboxy groups, salt-type carboxy groups and —NH— bond. When at least one of these groups is contained, the polyimide and/or polyamideimide ordinarily have both the carboxyl group and/or the salt-type carboxy group and —NH— bond. As to the carboxy group and/or the salt-type carboxy group, the polyimide and/or the polyamideimide may have only a carboxy group, may have only a salt-type carboxy group, or may have a carboxy group and a salt type. It may also have both of a carboxy group. The ratio between the carboxy group and the salt-type carboxy group in the polyimide and/or the polyamideimide even in identical polyimides and/or polyamideimides, may vary depending upon an environment where the polyimide and/or the polyamideimide exist and also upon the concentration of the cation component.

For the polyimide, the total number of moles of carboxy groups and salt-type carboxy groups in the polyimide and/or polyamideimide of the present invention is usually equimolar to the —NH— bond, and in particular, in the method for manufacturing a polyimide porous membrane (to be described later), when the carboxy group and/or the salt-type carboxy group is formed from part of an imide bond in the polyimide, —NH— bond is also substantially simultaneously formed, the total number of moles of carboxy groups and salt-type carboxy groups is equimolar to the formed —NH— bond. For the polyamideimide, the total number of moles of carboxy groups and salt-type carboxy groups in polyamideimide is not necessarily equimolar to the —NH— bond, but depends on the conditions of an imide bond ring-opening step such as chemical etching described later. The —NH— bond is preferably part of an amide bond (—NH—C(=O)—).

The polyimide and/or the polyamideimide of the present invention may be one having at least one unit selected from the group consisting of constitutional units represented by the following formulae (3) to (6). The polyimide may include constitutional units represented by the following formula (3) and/or formula (4), and the polyamideimide may include constitutional units represented by the following formula (5) and/or (6).

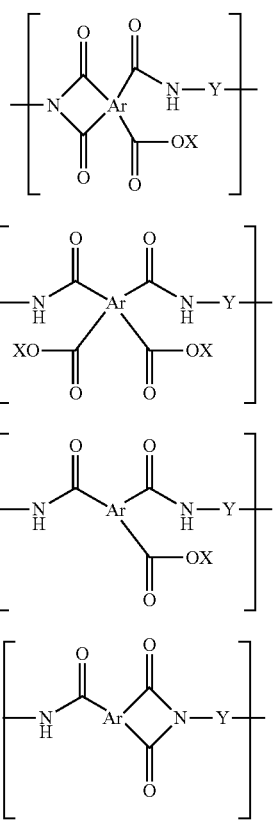

In the above formula, X is the same or different and is a hydrogen atom or a cation component. Ar is an aryl group and may be the same as an aryl group represented by Ar to which the carbonyl group is bonded in a repeating unit represented by the formula (1) constituting the polyamide acid (to be described later) or a repeating unit represented by the formula (2) constituting the aromatic polyimide. Y is a divalent residue excluding the amino group of the diamine compound and may be the same as an aryl group represented by Ar to which N is bonded in a repeating unit represented by the formula (1) constituting the polyamide acid (to be described later) or a repeating unit represented by the formula (2) constituting the aromatic polyimide.

The polyimide and/or the polyamideimide of the present invention respectively may have a constituent unit represented by the formula (3) and/or the formula (4) and a constituent unit represented by the formula (5) formed as a result of the ring-opening of part of imide bond ([—C(=O)]$_2$ —N—) possessed by general polyimides and/or polyamideimides. For the polyamideimide, however, the present inventors have found that the object of the present invention can also be attained by only having an amide bond (—NH—C(=O)—) originally possessed irrespective of the ring-opening of an imide bond possessed by a general polyamideimide. Also for the polyamideimide, the presence of a constituent unit represented by the formula (5) formed as a result of the ring-opening of part of imide bond originally possessed by the polyamideimide.

(1) The polyimide and/or the polyamideimide of the present invention may be brought to a polyimide and/or polyamideimide porous membrane having at least one group selected from the group consisting of carboxy groups, salt-type carboxy groups, and —NH— bond by the ring-opening of part of the imide bond. The unconversion rate in the ring-opening of part of the imide bond is determined as follows. For the polyimide and/or polyamideimide porous membrane not subjected to an imide bond ring-opening process (to be described later) (provided that, when varnish for the preparation of the porous membrane contains a polyamide acid, an imidization reaction is regarded as having been substantially completed in a burning step), a value (X1) is determined by dividing the area of a peak representing the imide bond measured by the Fourier transform infrared spectroscopy (FT-IR) apparatus by the area of a peak representing benzene measured also by the FT-IR apparatus.

(2) Regarding the resultant polyimide and/or polyamide porous membrane, using the same polymer (varnish) as the porous membrane for which the value (X1) was determined, for the polyimide and/or polyamide porous membrane after the imide bond ring-opening step (to be described later), a value (X2) is determined by dividing the area of a peak representing the imide bond measured by the Fourier transform infrared spectroscopy (FT-IR) apparatus by the area of a peak representing benzene measured also by the FT-IR apparatus.

(3) Unconversion rate (%)=(X2)÷(X1)×100

For the polyimide and/or polyamideimide porous membrane of the present invention, the unconversion rate is preferably 60% or more, more preferably 70% to 99.5%, still more preferably 80 to 99%. A porous membrane containing polyamideimide originally contains an —NH— bond that constitutes an amide bond (—NH—C(=O)—) that is originally contained independently of the ring-opening of the imide bond, and, thus, in this case, the unconversion rate may be 100%.

When the polyimide and/or polyamideimide porous membrane of the present invention is a polyimide porous membrane, a value is determined as an imidization ratio by dividing the area of a peak representing the imide bond measured by Fourier transform infrared spectroscopy (FT-IR) apparatus by the area of a peak representing benzene measured by the FT-IR apparatus. For the polyimide, the X2 value as described above is preferably 1.2 or more, more preferably 1.2 to 2, still more preferably 1.3 to 1.6, even more preferably 1.30 to 1.55, particularly preferably 1.35 to less than 1.5. Further, in the present invention, the imidization ratio for X1 is preferably 1.5 or more. For the imidization ratio, the relatively larger the numeral, the greater the number of imide bonds, that is, the less the ring-opened imide bonds described above.

<Method for Producing Polyimide-Based Resin Porous Membrane>

The polyimide and/or polyamideimide porous membrane of the present invention can be produced by a method including a step of forming a carboxy group and/or a salt-type carboxy group from part of an imide bond in polyimide and/or polyamideimide (hereinafter it may be referred to as "imide bond ring-opening step"). In the imide bond ring-opening step, as described above, when a carboxy group and/or a salt-type carboxy group is formed from part of the imide bond, theoretically, an —NH— bond equimolar to these groups is also substantially simultaneously formed. The imide bond ring-opening step is preferably carried out by chemical etching (to be described later).

However, when the resin contained in the polyimide and/or polyamideimide porous membrane is substantially composed of polyamideimide, the resin has already —NH— bond without imide bond ring-opening process, contributing top favorable adsorption power. Accordingly, there is no need to decrease the flow rate of the fluid, and, thus, the imide bond ring-opening step is not always necessary. Preferably, however, the imide bond ring-opening step is carried out from the viewpoint of effectively attaining the object of the present invention.

The method for manufacturing a polyimide and/or polyamideimide porous membrane of the present invention includes a step of forming a carboxy group and/or a salt-type carboxy group from part of imide bonds in polyimide and/or polyamideimide (imide bond ring-opening step).

In the method for manufacturing a polyimide and/or polyamideimide porous membrane used in the present invention, preferably, a molded membrane of a film or the like composed mainly of a polyimide and/or a polyamideimide (which may be abbreviated to "polyimide and/or polyamideimide molded membrane") is prepared followed by the imide bond ring-opening step. The polyimide and/or polyamideimide molded article to be subjected to the imide bond ring-opening step may be porous or nonporous, and the shape thereof is not particularly limited. From the viewpoint of enhancing the porosity in the polyimide and/or polyamideimide porous membrane, preferably, the polyimide and/or polyamideimide molded membrane is porous and/or is preferably in the form of a thin shape such as a film.

As described above, the polyimide and/or polyamideimide molded membrane may be non-porous when subjected to the imide bond ring-opening step. In this case, preferably, pores are formed after the imide bond ring-opening step. A method of porous formation of the polyimide and/or polyamideimide molded membrane irrespective of whether it is before or after the imide bond ring-opening step is preferably a method including a fine particle removing step in which fine particles are removed from a composite membrane of a polyimide and/or a polyamideimide with fine particles (which may hereinafter be referred to as "polyimide-based resin-fine particle composite membrane") for the porous formation.

In the method for manufacturing a polyimide and/or polyamideimide porous membrane used in the present invention, (a) before the fine particle removing step, the composite membrane of the polyimide and/or the polyamideimide with the fine particles may be subjected to the imide bond ring-opening step, or alternatively, (b) after the fine particle removing step, the polyimide and/or polyamideimide molded membrane that has been rendered porous by the step may be subjected to the imide bond ring-opening step. However, the latter method (b) is preferred from the viewpoint of enhancing the porosity in the resultant polyimide and/or polyamideimide porous membrane.

The method for manufacturing the polyimide and/or polyamideimide porous membrane of the present invention will be described in more detail by mainly taking the form of a membrane (a porous membrane) that is a preferred embodiment. The membrane can be suitably produced using a varnish.

[Manufacture of Varnish]

Varnish production is carried out by mixing an organic solvent containing fine particles previously dispersed therein with polyamide acid, polyimide or polyamideimide at any ratio, or by polymerizing tetracarboxylic acid dianhydride and diamine in an organic solvent containing fine particles previously dispersed therein to form a polyamide acid, or by further subjecting the polyamide acid to imidization to form a polyimide. And finally, the viscosity is preferably 300 to 2000 cP (0.3 to 2 Pa·s), more preferably 400 to 1800 cP (0.4 to 1.8 Pa·s). When viscosity of the varnish is in the above defined range, the film can be evenly formed.

In the varnish, in preparing a polyimide-based resin-fine particle membrane by burning (or drying when the burning is optional), fine particles of resin and polyamide acid or polyimide or polyamideimide may be mixed together so that the fine particle/polyimide-based resin ratio is 1 to 4 (mass ratio), and the fine particle/polyimide-based resin ratio is preferably 1.1 to 3.5 (mass ratio). Further, in preparing the polyimide-based resin-fine particle composite membrane, fine particles and polyamide acid or polyimide, or polyamideimide may be mixed together so that the fine particle/polyimide-based resin volume ratio is 1.1 to 5. Further, the fine particle/polyimide-based resin ratio is more preferably 1.1 to 4.5 (volume ratio). When the mass ratio or the volume ratio of the fine particle/polyimide-based resin is not less than the lower limit value, pores having an appropriate density as the porous membrane. When mass ratio or the volume ratio of the fine particle/polyimide-based resin is not more than the upper limit value, the membrane can be stably formed without posing a problem of an increase in viscosity or cracking in the membrane. It is noted that in the present specification, the volume % and the volume ratio are values at 25° C.

<Fine Particles>

The fine particles used in the present invention may be formed of any material without particular limitation as long as the material is insoluble in the organic solvent used in the varnish and can be selectively removed after the film formation. Examples of inorganic materials include metal oxides such as silica (silicon dioxide), titanium oxide, alumina ($Al_2O_3$), and calcium carbonate, and examples of organic materials include fine particles of organic polymers (resin fine particles) such as high molecular weight olefins (for example, polypropylene, polyethylene), polystyrenes, acrylic resins (resins of methyl methacrylate, isobutyl methacrylate, polymethyl methacrylate (PMMA), etc.), epoxy resins, celluloses, polyvinyl alcohols, polyvinyl butyrals, polyesters, polyethers, and polyethylenes.

Examples of inorganic materials in producing polyimide-based resin porous membranes can include silicas such as colloidal silica or PMMA that are fine particles of organic polymers. Among others, spherical particles are preferably selected from the viewpoint of forming very small pores having a curved inner surface.

Fine particles of resin used in the present invention may be selected, for example, from ordinary linear polymers and publicly known depolymerizable polymers according to purposes without particular limitation. The ordinary linear polymer is a polymer that undergoes random cleaving of molecular chains of the polymer in thermal decomposition, and the depolymerizable polymer is a polymer that is decomposed into monomers in thermal decomposition. Both the resins can be removed from the polyimide-based resin film by decomposing them into monomers, low molecular weight substances, or $CO_2$ at the time of heating. The decomposition temperature of the resin fine particles used is preferably 200 to 320° C., more preferably 230 to 260° C. When the decomposition temperature is 200° C. or more, the film can be formed even when a high boiling point solvent is used for the varnish, and the range of selection of burning conditions for the polyimide-based resin is widened. When the decomposition temperature is 320° C. or less, only the resin fine particles can be allowed to disappear without thermal damage to the polyimide-based resin.

Among these depolymerizable polymers, methyl methacrylate or isobutyl methacrylate alone (polymethyl methacrylate or polyisobutyl methacrylate) having a low thermal decomposition temperature alone or a copolymerized polymer containing them as a main component is preferable from the viewpoint of handling during pore formation.

The fine particles used in the present invention are preferably those having a high sphericity ratio from the viewpoint of easy formation of curved inner surfaces in the resultant porous membrane. The particle diameter (average diameter) of the fine particles to be used may be, for example, 50 to 2000 nm, preferably 200 to 1000 nm. Preferably, when a polyimide-based resin porous membrane obtained by removing fine particles is used as a separating material or an adsorbing material to allow a fluid to pass through, a fluid can be brought into full contact with the inner surface of the pores in the porous membrane, so that minute substances such as metal particles contained in the fluid can be efficiently adsorbed. The particle diameter distribution index (d25/75) may be from 1 to 6, preferably from 1.6 to 5, more preferably from 2 to 4. When the lower limit is 1.6 or more, particles can be efficiently filled in the inside of the membrane, and, thus, a flow channel is likely to be formed, advantageously contributing to improved flow rate. Further, it is considered that pores having a different size are formed, and the convection is changed, contributing to improved adsorption. However, it should be noted that, as long as the particle diameter distribution index (d25/75) of the fine particles is 1 or more, even if it is less than 1.6, the flow rate and the adsorption rate are favorable, and the fracture elongation is likely to be improved. It is to be noted that d25 and d75 are the values of particle diameters of 25% and 75%, respectively, of the particle size distribution, and in this specification, d25 is the larger particle diameter.

Further, in the manufacturing method (to be described later), when the unburned composite membrane is formed as a two-layered unburned composite membrane, the fine particles (B1) used for the first varnish and the fine particles (B2) used for the second varnish may be the same or different. In order to make the pores on the side in contact with the base material denser, preferably, the fine particles of (B1) have smaller or the same particle size distribution index than the fine particles of (B2). Alternatively, preferably, the fine particles of (B1) have a smaller sphericity ratio than the fine particles of (B2) or are the same. Further, preferably, the fine particles of (B1) have smaller particle diameters (average diameters) of the fine particles than the fine particles of (B2). In particular, fine particles of (B1) having a diameter of 100 to 1000 nm (more preferably 100 to 600 nm) and fine particles of (B2) having a diameter of 500 to 2000 nm (more preferably 700 to 2000 nm) are preferred. When the diameter of the fine particles of (B1) is smaller than the diameter of the fine particles of (B2), the opening ratio of the pores on the surface of the obtained porous polyimide-based resin porous membrane can be made uniform and high; and the strength of the porous membrane (membrane) can be increased as compared with the case where the entirety of the porous polyimide-based resin porous membrane has the particle diameter of the fine particles of (B1).

In the present invention, in order to uniformly disperse the fine particles in the varnish, a dispersant may be further added together with the fine particles. The addition of the dispersant can allow polyamide acid, polyimide or polyamideimide to be more uniformly mixed with the fine particles, and fine particles in the molded or formed precursor film can be uniformly distributed. As a result, in order to provide dense openings in the surface of the finally obtained polyimide-based resin porous membrane and to improve the air permeability of the polyimide-based resin porous membrane, interconnected pores through which the front and back surfaces of the porous membrane are efficiently interconnected can be formed.

The dispersant used in the present invention is not particularly limited and publicly known dispersants can be used. Examples of dispersants include, but are not limited to, anionic surfactants such as coconut fatty acid salts, castor sulfated oil salts, lauryl sulfate salts, polyoxyalkylene allyl phenyl ether sulfate salts, alkylbenzene sulfonic acids, alkyl benzene sulfonates, alkyl diphenyl ether disulfonates, alkyl naphthalene sulfonates, dialkyl sulfosuccinates, isopropyl phosphate, polyoxyethylene alkyl ether phosphate salts, polyoxyethylene allyl phenyl ether phosphate salts; cationic surfactants such as oleyl amine acetate, lauryl pyridinium chloride, cetyl pyridinium chloride, lauryl trimethyl ammonium chloride, stearyl trimethyl ammonium chloride, behenyltrimethylammonium chloride, didecyl dimethyl ammonium chloride; amphoteric surfactants such as cocoalkyldimethylamine oxide, fatty acid amidopropyldimethylamine oxide, alkylpolyaminoethylglycine hydrochloride, amidobetaine type activator, alanine type activator, lauryliminodipropionic acid and the like; nonionic surfactants such as polyoxyethylene octyl ether, polyoxyethylene decyl ether, polyoxyethylene lauryl ether, polyoxyethylene lauryl amine, polyoxyethylene oleyl amine, polyoxyethylene polystyryl phenyl ether, polyoxyalkylene polystyryl phenyl ether, etc., nonionic surfactants of polyoxyalkylene parimary alkyl ether or polyoxyalkylene secondary alkyl ether, and nonionic surfactants of other polyoxyalkylenes such as polyoxyethylene dilaurate, polyoxyethylene laurate, polyoxyethylenated castor oil, polyoxyethylenated hardened castor oil, sorbitan lauric acid ester, polyoxyethylene sorbitan lauric acid ester, fatty acid diethanol amide and the like; fatty acid alkyl esters such as octyl stearate and trimethylolpropane tridecanoate; and polyether polyols such as polyoxyalkylene butyl ether, polyoxyalkylene oleyl ether and trimethylolpropane tris (polyoxyalkylene) ether. Further, two or more of the above dispersants can be used as a mixture.

<Polyamide Acid>

In the present invention, polyamide acids obtained by polymerizing any tetracarboxylic acid dianhydride and diamine may be used without particular limitation. The amount of the tetracarboxylic acid dianhydride and the diamine used is not particularly limited, but is preferably 0.50 to 1.50 moles, more preferably 0.60 to 1.30 moles, 0.70 to 1.20 moles, per 1 mole of the tetracarboxylic dianhydride.

The tetracarboxylic acid dianhydride can be appropriately selected from tetracarboxylic acid dianhydrides that have been hitherto been used as a starting material for synthesis of polyamide acids. The tetracarboxylic dianhydride may be an aromatic tetracarboxylic dianhydride or an aliphatic tetracarboxylic dianhydride. Preferably, however, from the viewpoint of heat resistance of the resultant polyimide resin, the use of aromatic tetracarboxylic acid dianhydride is preferred. Two or more tetracarboxylic acid dianhydrides may be used in combination.

Specific examples of preferred aromatic tetracarboxylic dianhydrides include pyromellitic dianhydride, 1,1-bis (2,3-dicarboxyphenyl) ethane dianhydride, bis (2,3-dicarboxyphenyl) methane dianhydride, bis (3,4-dicarboxyphenyl) methane dianhydride, 3,3',4,4'-biphenyltetracarboxylic dianhydride, 2,3,3',4'-biphenyltetracarboxylic dianhydride, 2,2,6,6-biphenyltetracarboxylic dianhydride, 2,2-bis(3,4-dicarboxyphenyl) propane dianhydride, 2,2-bis (2,3-dicarboxyphenyl) propane dianhydride, 2,2-bis(3,4-dicarboxyphenyl)-1,1,1,3,3,3-hexafluoropropane dianhydride, 2,2-bis (2,3-dicarboxyphenyl)-1,1,1,3,3,3-hexafluoropropane dianhydride, 3,3',4,4'-benzophenonetetracarboxylic dianhydride, bis(3,4-dicarboxyphenyl) ether dianhydride, bis(2,3-dicarboxyphenyl) ether dianhydride, 2,2',3,3'-benzophenonetetracarboxylic dianhydride, 4,4-(p-phenylenedioxy) diphthal acid dianhydride, 4,4-(m-phenylenedioxy) diphthalic acid dianhydride, 1,2,5,6-naphthalenetetracarboxylic dianhydride, 1,4,5,8-naphthalenetetracarboxylic acid dianhydride, 2,3,6,7-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, 1,2,7,8-phenanthrene tetracarboxylic dianhydride, fluorene 9,9-bis phthalic anhydride, 3,3',4,4'-diphenylsulfone tetracarboxylic acid dianhydride and the like. Examples of aliphatic tetracarboxylic dianhydrides include ethylene tetracarboxylic dianhydride, butanetetracarboxylic dianhydride, cyclopentane tetracarboxylic dianhydride, cyclohexane tetracarboxylic dianhydride, 1,2,4,5-cyclohexane tetracarboxylic dianhydride, 1,2,3,4-cyclohexane tetracarboxylic dianhydride, and the like. Among them, 3,3',4,4'-biphenyltetracarboxylic acid dianhydride and pyromellitic acid dianhydride are preferred, for example, from the viewpoints of price and easy availability. These tetracarboxylic dianhydrides can be used alone or in combination of two or more.

The diamine can be appropriately selected from diamines that have hitherto been used as starting materials for synthesis of polyamide acids. This diamine may be either an aromatic diamine or an aliphatic diamine. Preferably, however, from the viewpoint of the heat resistance of the resultant polyimide resin, an aromatic diamine is preferable. Two or more of these diamines may be used in combination.

Aromatic diamines include diamino compounds in which one phenyl group or about 2 to 10 phenyl groups are bonded. Specific examples thereof include phenylenediamine and derivatives thereof, diaminobiphenyl compounds and derivatives thereof, diaminodiphenyl compounds and derivatives thereof, diaminotriphenyl compounds and derivatives thereof, diaminonaphthalene and derivatives thereof, aminophenylaminoindane and derivatives thereof, diaminotetraphenyl compounds and derivatives thereof, diaminohexaphenyl compounds and derivatives thereof, cardo-type fluorenediamine derivatives.

Examples of phenylenediamines include m-phenylenediamine and p-phenylenediamine. Examples of phenylenediamine derivatives include diamines to which alkyl groups such as methyl group and ethyl group are bonded, for example, 2,4-diaminotoluene and 2,4-triphenylene diamine.

Diaminobiphenyl compounds are those including two aminophenyl groups bonded to each other through phenyl groups Examples thereof include 4,4'-diaminobiphenyl, 4,4'-diamino-2,2'-bis (trifluoromethyl) biphenyl and the like.

Diaminodiphenyl compounds are those including two aminophenyl groups bonded to each other through another group via another group. The bond is an ether bond, a sulfonyl bond, a thioether bond, a bond by an alkylene or a derivative group thereof, an imino bond, an azo bond, a phosphine oxide bond, an amide bond, an ureylene bond or the like. In the alkylene bond, the number of carbon atoms is about 1 to 6 and its derivative group is one in which one or more hydrogen atoms of an alkylene group is substituted with a halogen atom or the like.

Examples of diaminodiphenyl compounds include 3,3'-diaminodiphenyl ether, 3,4'-diaminodiphenyl ether, 4,4'-diaminodiphenyl ether, 3,3'-diaminodiphenyl sulfone, 3,4'-diaminodiphenyl sulfone, 4,4'-diaminodiphenyl sulfone, 3,3'-diaminodiphenylmethane, 3,4'-diaminodiphenylmethane, 4,4'-diaminodiphenylmethane, 4,4'-diaminodiphenyl sulfide, 3,3'-diaminodiphenyl ketone, 3,4'-diaminodiphenyl ketone, 2,2-bis(p-aminophenyl) propane, 2,2'-bis(p-aminophenyl)hexafluoropropane, 4-methyl-2,4-bis(p-aminophenyl)-1-pentene, 4-methyl-2,4-bis(p-aminophenyl)-2-pentene, iminodianilin, 4-methyl-2,4-bis(p-aminophenyl) pentane, bis(p-aminophenyl) phosphine oxide, 4,4'-diaminoazobenzene, 4,4'-diaminodiphenylurea, 4,4'-diaminodiphenylamide, 1,4-bis (4-aminophenoxy)benzene, 1,3-bis (4-aminophenoxy)benzene, 1,3-bis (3-aminophenoxy)benzene, 4,4'-bis (4-aminophenoxy)biphenyl, bis[4-(4-aminophenoxy) phenyl] sulfone, bis [4-(3-aminophenoxy)phenyl] sulfone, 2,2-bis[4-(4-aminophenoxy)phenyl]propane, 2,2-bis[4-(4-aminophenoxy)phenyl]hexafluoropropane and the like.

Among them, p-phenylenediamine, m-phenylenediamine, 2,4-diaminotoluene, and 4,4'-diaminodiphenyl ether are preferred, for example, from the viewpoint of price and easy availability.

The diaminotriphenyl compound is one in which two aminophenyl groups and one phenylene group are bonded via another group and the other groups are selected from those similar to the diaminodiphenyl compound. Examples of diaminotriphenyl compounds can include 1,3-bis(m-aminophenoxy)benzene, 1,3-bis(p-aminophenoxy)benzene and 1,4-bis (p-aminophenoxy)benzene.

Examples of diaminonaphthalenes can include 1,5-diaminonaphthalene and 2,6-diaminonaphthalene.

Examples of aminophenylaminoindanes can include 5 or 6-amino-1-(p-aminophenyl)-1,3,3-trimethylindane.

Examples of diaminotetraphenyl compounds can include 4,4'-bis(p-aminophenoxy)biphenyl, 2,2'-bis[p-(p'-aminophenoxy)phenyl] propane, 2,2'-bis[p-(p'-aminophenoxy)biphenyl]propane, 2,2'-bis [p-(m-aminophenoxy)phenyl]benzophenone and the like.

Examples of cardo-type fluorenediamine derivatives can include 9,9-bisaniline fluorene and the like.

Examples of aliphatic diamines include those having about 2 to 15 carbon atoms, and specific examples thereof include pentamethylene diamine, hexamethylene diamine, heptamethylene diamine and the like.

The diamine may be a compound in which the hydrogen atom is substituted with at least one substituent selected from the group consisting of a halogen atom, a methyl group, a methoxy group, a cyano group, a phenyl group and the like.

Polyamide acids used in the present invention may be produced by any method without particular limitation, and examples thereof include a publicly known method in which an acid and a diamine component are reacted in an organic solvent.

The reaction between the tetracarboxylic acid dianhydride and the diamine is usually carried out in an organic solvent. The organic solvent used for the reaction between the tetracarboxylic acid dianhydride and the diamine is not particularly limited as long as it can dissolve the tetracarboxylic acid dianhydride and the diamine and does not react with the tetracarboxylic acid dianhydride and the diamine. Organic solvents can be used alone or as a mixture of two or more.

Examples of organic solvents used in the reaction of tetracarboxylic dianhydride and diamine include nitrogen-containing polar solvents such as N-methyl-2-pyrrolidone, N,N-dimethylacetamide, N,N-diethylacetamide, N,N-dimethyl formamide, N,N-diethylformamide, N-methyl caprolactam, N,N,N',N'-tetramethylurea; lactone-based polar solvents such as β-propiolactone, γ-butyrolactone, γ-valerolactone, δ-valerolactone, γ-caprolactone, and ε-caprolactone; dimethyl sulfoxide; acetonitrile; fatty acid esters such as ethyl lactate and butyl lactate; ethers such as diethylene glycol dimethyl ether, diethylene glycol diethyl ether, dioxane, tetrahydrofuran, methyl cellosolve acetate, ethyl cellosolve acetate; and phenolic solvents such as cresols. These organic solvents may be used alone or in a combination of two or more. Among them, a combination of the nitrogen-containing polar solvent and the lactone-based polar solvent is preferred. The amount of the organic solvent used is not particularly limited. Preferably, however, the content of the polyamide acid produced is preferably 5 to 50% by mass.

Among these organic solvents, because of the solubility of polyamide acid to be produced, nitrogen-containing polar solvents such as N-methyl-2-pyrrolidone, N,N-dimethylacetamide, N,N-diethylacetamide, N,N-dimethylformamide, N,N-diethylformamide, N-methylcaprolactam, and N,N,N',N'-tetramethylurea are preferred. From the viewpoint of film formation and the like, a mixed solvent containing a lactone-based polar solvent such as γ-butyrolactone added thereto may be used, and the content of the lactone-based polar solvent in the whole organic solvent is 1 to 20% by mass, more preferably 5 to 15% by mass.

The polymerization temperature is ordinarily −10 to 120° C., preferably 5 to 30° C. The polymerization time varies depending on the starting material composition used, but is usually 3 to 24 hours. Further, the intrinsic viscosity of the polyamide acid solution obtained under such conditions is preferably in the range of 1000 to 100000 cPs (centipoises), more preferably in the range of 5000 to 70000 cPs.

<Polyimide>

In the polyimide used in the present invention, the structure and the molecular weight are not particularly limited, and publicly known polyimides are usable as long as the polyimides are soluble in organic solvents used for varnish of the present invention. The polyimide may have on its side chain a condensable functional group or a functional group that promotes a crosslinking reaction or the like during burning.

In order to render the polyimide soluble in organic solvents, the use of monomers for introducing a flexible bend structure in the main chain, for example, aliphatic diamines such as ethylenediamine, hexamethylenediamine, 1,4-diaminocyclohexane, 1,3-diaminocyclohexane, 4,4'-diaminodicyclohexylmethane; aromatic diamines such as 2-methyl-1,4-phenylenediamine, o-tolidine, m-tolidine, 3,3'-dimethoxybenzidine, and 4,4'-diaminobenzanilide; polyoxyalkylene diamines such as polyoxyethylene diamine, polyoxypropylene diamine, and polyoxybutylene diamine; polysiloxane diamine; and acid anhydrides such as 2,3,3',4'-oxydiphthalic anhydride, 3,4,3',4'-oxydiphthalic anhydride, 2,2-bis(4-hydroxyphenyl)propane dibenzoate-3, 3',4,4'-tetracarboxylic dianhydride is effective. Further, the use of monomers having a functional group that improves solubility in organic solvents, for example, fluorinated diamines such as 2,2'-bis(trifluoromethyl)-4,4'-diaminobiphenyl, 2-trifluoromethyl-1,4-phenylenediamine is also effective. Furthermore, in addition to the monomers for improving the solubility of the polyimide, the same monomers as described above in connection with the polyamide acids can also be used in combination as long as the solubility is not impaired.

The polyimide soluble in organic solvents used in the present invention may be produced by any publicly known methods without particular limitation, for example, a method in which a polyamide acid is chemically imidized or heat-imidized followed by dissolution in an organic solvent. Examples of such polyimides can include aliphatic polyimides (wholly aliphatic polyimides), aromatic polyimides and the like, and aromatic polyimides are preferred. Aromatic polyimides include those produced by subjecting a polyamide acid containing a repeating unit represented by the formula (1) to heat or chemical ring-closing reaction, or by dissolving a polyimide having a repeating unit represented by the formula (2) in a solvent. In the formula, Ar represents an aryl group.

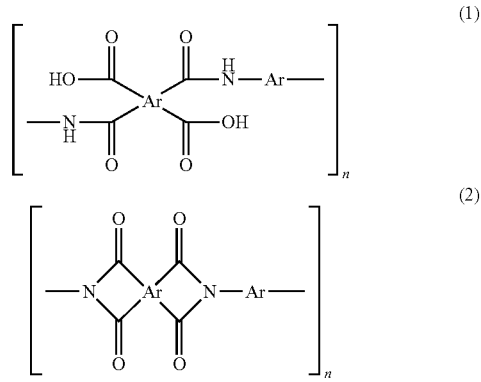

<Polyamideimide>

For the polyamideimide used in the present invention, the structure and the molecular weight are not particularly limited, and publicly known polyamideimides can be used as long as the polyamideimides are soluble in organic solvents used for varnish in the present invention. The polyamideimide may have on its side chain a condensable functional group or a functional group that promotes a crosslinking reaction or the like during burning.

Further, polyamideimides produced by reacting any trimellitic anhydride with diisocyanate, or by reacting any reactive derivative of trimellitic anhydride with a diamine to give a precursor polymer and imidizing the precursor polymer may be used without particular limitation.

Examples of any trimellitic anhydrides or reactive derivatives thereof include trimellitic anhydrides, trimellitic anhydride acid halides such as trimellitic anhydride chloride, and trimellitic anhydride esters.

Examples of any diisocyanates include meta-phenylene diisocyanate, p-phenylene diisocyanate, o tolidine diisocyanate, p-phenylene diisocyanate, m-phenylene diisocyanate, 4,4'-oxybis (phenyl isocyanate), 4,4'-diisocyanate diphenylmethane, bis[4-(4-isocyanate phenoxy)phenyl]sulfone, 2,2'-bis[4-(4-isocyanate phenoxy)phenyl]propane, 2,4-tolylene diisocyanate, 2,6-tolylene diisocyanate, 4,4'-diphenylmethane diisocyanate, 3,3'-dimethylphenyl-4,4'-diisocyanate, 3,3'-diethylphenyl-4,4'-diisocyanate, isophorone diisocyanate, hexamethylene diisocyanate, 4,4'-dicyclohexylmethane diisocyanate, m-xylene diisocyanate, p-xylene diisocyanate, naphthalene diisocyanate and the like.

Any diamines include those exemplified above in connection with the polyamide acid.

<Organic Solvent>

The organic solvent used for the varnish is not particularly limited as long as it can dissolve the polyamide acid and/or the polyimide-based resin and does not dissolve the fine particles. Examples thereof include those exemplified above in connection with solvents used in the reaction between the tetracarboxylic dianhydride and the diamine. The solvents may be used alone or in a combination of two or more.

Among all components in the varnish, the content of the mixed solvent (S) is preferably from 50 to 95% by mass, more preferably from 60 to 85% by mass. The solid content of the varnish is preferably 5 to 50% by mass, more preferably 15 to 40% by mass.

Further, in the manufacturing method (to be described later), when the unburned composite membrane is formed as a two-layered unburned composite membrane, the volume ratio of the polyamide acid, polyimide or polyamideimide (A1) and fine particles (B1) in the first varnish is preferably 19:81 to 45:65. When the fine particle volume is 65 or more when the total volume is presumed to be 100, the particles are uniformly dispersed, and when the fine particle volume is 81 or less, the particles do not agglomerate and are dispersed, so that pores are uniformly formed on the substrate side of the polyimide-based resin molded membrane. In the second varnish, the volume ratio of the polyamide acid, polyimide or polyamideimide (A2) to the fine particles (B2) is preferably 20:80 to 50:50. When the fine particle volume is 50 or more when the total volume is presumed to be 100, the particles are uniformly dispersed, and when the fine particle volume is 80 or less, the particles do not agglomerate, and cracks and the like do not occur on the surface. Accordingly, polyimide-based resin porous membranes having favorable mechanical properties such as stress resistance and fracture elongation can be stably formed.

Regarding the volume ratio, the second varnish preferably has a smaller particle content ratio than the first varnish. When the above requirement is met, even in filling of fine particles in the polyamide acid, polyimide, or polyamideimide at a high density, the strength and flexibility of the unburned composite membrane, the polyimide-based resin-fine particle composite membrane, and the polyimide-based resin porous membrane can be ensured. Further, the production cost can be lowered by providing a layer having a low fine particle content.

In addition to the above components, for the purposes of antistatic properties, imparting flame retardancy, performing low-temperature burning, releasability, coatability, etc., publicly known additives, for example, antistatic agents, flame retardants, chemical imidizing agents, condensing agents, release agents, and surface modifiers can be incorporated according to need.

[Production of Unburned Composite Membrane]

Regarding the molding of the unburned composite membrane containing the polyamide acid or the polyimide-based resin and the fine particles, film formation is carried out by coating the varnish on a substrate and drying the coating at 0 to 120° C. (preferably 0 to 100° C.) under atmospheric pressure or in vacuum, more preferably at 60 to 95° C. (still more preferably 65 to 90° C.) under atmospheric pressure. The coating thickness may be, for example, 1 to 500 μm, preferably 5 to 50 μm. A release layer may be if necessary provided on the substrate. Further, in the production of the unburned composite membrane, before the production (burning step) of the polyimide-based resin-fine particle composite membrane (to be described later), the step of dipping in a solvent containing water, the step of pressing, the step of drying after the dipping step may be optionally provided.

The release layer may be prepared by coating a release agent on a substrate and drying or baking the coating. Publicly known release agents such as alkyl phosphate ammonium salt-based, fluorine-based or silicone release agents can be used as the release agent without particular limitation. When the unburned composite membrane containing the dried polyamide acid or polyimide-based resin and fine particles is released from the substrate, the release agent remains slightly on the release surface of the unburned composite membrane. Since the remaining release agent can affect the wettability of the surface of the porous polyimide-based resin membrane and contamination of impurities, the remaining release agent is preferably removed.

Therefore, preferably, the unburned composite membrane separated from the substrate is cleaned with organic solvents or the like. The unburned composite membrane may be cleaned by a method selected from publicly known methods such as a method in which the unburned composite membrane is dipped in a cleaning solution and is then taken out, and a method in which shower cleaning is carried out. Furthermore, in order to dry the unburned composite membrane after cleaning, publicly known methods such as air-drying of the unburned composite membrane after cleaning at room temperature, warming to an appropriate predetermined temperature in a thermostatic chamber, etc. may be applied without particular limitation. For example, a method in which the end of the unburned composite membrane is fixed to SUS frame or the like may also be adopted to prevent deformation.

On the other hand, when a substrate as such used without the provision of a release layer in film formation of the unburned composite membrane, the step of forming the release layer and the step of cleaning the unburned composite membrane can be omitted.

When the unburned composite membrane is formed in a two-layered structure, a method may be adopted in which the first varnish as such is coated on a substrate such as a glass substrate and drying the coating at 0 to 120° C. (preferably 0 to 90° C.) under atmospheric pressure or in vacuum, more preferably at 10 to 100° C. (still more preferably 10 to 90° C.) under atmospheric pressure to form a first unburned composite membrane having a layer thickness of 1 to 5 μm.

Subsequently, the second varnish is coated on the formed first unburned composite membrane, and the coating is dried at 0 to 80° C. (preferably 0 to 50° C.) in the same manner as in the formation of the first unburned composite membrane, more preferably at 10 to 80° C. (still more preferably 10 to 30° C.) under atmospheric pressure to form a second unburned composite membrane having a layer thickness of 5 to 50 μm and thus to obtain a two-layered unburned composite membrane.

[Production of Polyimide-Based Resin-Fine Particle Composite Membrane (Burning Step)]

The dried unburned composite membrane (or the two-layered unburned composite membrane; the same shall apply hereinafter) is subjected to heat post treatment (burning) to form a composite membrane composed of a polyimide-based resin and fine particles (a polyimide-based resin-fine particle composite membrane). When the varnish contains a polyamide acid, preferably, imidization is completed at the step of burning. The burning step is an optional step. In particular, when polyimide or polyamideimide is used as a varnish, the burning step may be omitted.

The burning temperature varies depending on the structure of the polyamide acid or polyimide-based resin contained in the unburned composite membrane or the presence or absence of a condensing agent, but is preferably from 120 to 400° C., more preferably from 150 to 375° C.

In burning, the burning step is not necessarily separated from the drying step. For example, when burning is carried out at 375° C., methods usable herein include a method including raising the temperature from room temperature to 375° C. over a period of 3 hours, keeping the material at 375° C. for 20 minutes, or a stepwise drying-thermal imidization method including raising the temperature stepwise from room temperature to 375° C. (keeping each step for 20 minutes) and finally keeping it at 375° C. for 20 minutes. At that time, a method in which the end of the unburned composite membrane is fixed to SUS frame or the like may also be adopted to prevent deformation.

The thickness of the finished polyimide-based resin-fine particle composite membrane, in the case where it is a film, for example, can be determined by measuring and averaging the thicknesses of a plurality of portions with a micrometer or the like. A preferred average thickness varies depending upon the use of the polyimide-based resin-fine particle composite membrane or the polyimide-based resin porous membrane. For example, when the product is used in separating materials, adsorbing materials or the like, a small thickness is preferred. For example, the thickness may be 1 μm or more, preferably 5 to 500 μm, more preferably 8 to 100 μm.

[Particulate Removing Step (Porous Formation of Polyimide-Based Resin-Fine Particle Composite Membrane)]

The polyimide-based resin porous membranes having micropores can be produced with favorable reproducibility by removing the fine particles from the polyimide-based resin-fine particle composite membrane by an appropriately selected method. For example, when silica is used as the fine particles, the polyimide-based resin-fine particle composite membrane can be made porous by dissolving and removing silica with low-concentration hydrogen fluoride water (HF) or the like. On the other hand, when the fine particles are resin fine particles, the resin fine particles can be removed by heating the material to a temperature equal to or above the thermal decomposition temperature of the resin fine particles as described above and below the thermal decomposition temperature of the polyimide-based resin to decompose the resin fine particles.

[Imide Bond Ring-Opening Step]

The method for producing a polyimide-based resin porous membrane of the present invention includes an imide bond ring-opening step as described above. Specifically, this step may be carried out by (a) a method in which, before the fine particle removing step, the polyimide-based resin-fine particle composite membrane is subjected to the imide bond ring-opening step, or alternatively, (b) a method in which, after the fine particle removing step, the polyimide-based resin molded membrane that has been rendered porous by the step is subjected to the imide bond ring-opening step. In the producing method (a), the imide bond that exists on the outer surface and near the outer surface of the polyimide-based resin molded membrane can be ring-opened and the object of the present invention can be attained. The latter method (b), however, is preferred because the porosity of the resultant polyimide-based resin porous membrane can be enhanced.

The imide bond ring-opening step can be carried out by a chemical etching method, a physical removal method, or a combination thereof. The chemical etching method is not particularly limited, and for example, a publicly known method can be used.

Treatment with a chemical etching solution such as an inorganic alkaline solution or an organic alkaline solution can be mentioned as the chemical etching method. Inorganic alkaline solutions are preferred. Examples of inorganic alkaline solutions include a hydrazine solution containing hydrazine hydrate and ethylenediamine, a solution of an alkali metal hydroxide such as potassium hydroxide, sodium hydroxide, sodium carbonate, sodium silicate, sodium metasilicate, etc., an ammonia solution, and an etching solution composed of an alkali hydroxide, hydrazine and 1,3-dimethyl-2-imidazolidinone as main components. Examples of organic alkaline solutions include primary amines such as ethylamine and n-propylamine; secondary amines such as diethylamine and di-n-butylamine; tertiary amines such as triethylamine and methyldiethylamine; alcohol amines such as dimethyl ethanol amine and triethanolamine; quaternary ammonium salts such as tetramethylammonium hydroxide and tetraethylammonium hydroxide; and cyclic amines such as pyrrole and piperidine.

For solvents of each of the solutions, pure water and alcohols can be appropriately selected. It is also possible to use those in which an appropriate amount of surfactant has been added. The alkali concentration is, for example, 0.01 to 20% by mass.

Further, physical methods include, for example, plasma etching (oxygen, argon, etc.), dry etching by corona discharge, or the like.

The above methods are preferred because they can be applied to any imide bond ring-opening step before the fine particle removing step or after the fine particle removing step. When the chemical etching method is carried out after the fine particle removing step, interconnected pores can easily be formed within the polyimide-based resin porous membrane, contributing to improved porosity.

When the chemical etching method is used as the imide bond ring-opening step, a cleaning step of the polyimide-based resin porous membrane may be carried out again to remove excessive etching solution components. Cleaning after chemical etching may be performed by cleaning with water alone. Preferably, however, a combination of acid cleaning and/or water cleaning is adopted. The polyimide-based resin porous membrane may be again subjected to the burning step to improve the wettability of the surface of the polyimide-based resin porous membrane to the organic solvent and to remove the remaining organic substances. As with burning conditions in [manufacture of polyimide-based resin-fine particle composite membrane (burning step)], burning conditions may be properly determined.

[Specific Liquid Purification Method]

The method for purifying a liquid according to the present invention includes allowing part or all of the liquid to be passed from one side to the other side of the polyimide and/or polyamideimide porous membrane described above by way of a differential pressure.

In the method for purifying a liquid according to the present invention, part or all of the liquid can be ordinarily passed from one side to the other side of the polyimide porous membrane described above by filtering part or all of the liquid through the polyimide-based resin porous membrane as a separating material or an adsorbing material. The polyimide-based resin porous membrane used as the separating material or the adsorbing material may be incorporated in a filter device (to be described later).

In the method for purifying a liquid in the present invention, the polyimide-based resin porous membrane may be used in a flat form or in the form of a pipe formed by combining opposite sides of the polyimide-based resin porous membrane. Preferably, the pipe-shaped polyimide-based porous membrane is in a folded form from the viewpoint of increasing the area of contact with the feed liquid. The polyimide-based resin porous membrane is properly subjected to sealing treatment (to be described later) so that the feed liquid is mixed with the filtrate.

The purification of the liquid may also be carried out using the polyimide-based porous membrane described above without applying a differential pressure, that is, by gravitational natural filtration, but is preferably carried out by taking advantage of a differential pressure. The differential pressure is not particularly limited as long as a pressure difference is provided between one side and the other side of the polyimide-based resin porous membrane. In general, however, for example, pressurizing in which pressure (positive pressure) is applied to one side (feed liquid side) of the polyimide-based resin porous membrane, depressurizing (negative pressure) in which one side (filtrate side) of the polyimide-based resin porous membrane is brought to a negative pressure may be mentioned, and the pressurizing is preferred.

Pressure is applied to the side of the polyimide-based resin porous membrane (feed liquid side) in which a liquid (which may be referred to as "feed liquid" in this specification) before being permeated through the polyimide-based resin porous membrane exists. It is preferable to apply pressure by utilizing, for example, the hydraulic pressure generated by circulating or feeding of the feed liquid or using the positive pressure of gas. The hydraulic pressure can be generated, for example, by a positive hydraulic pressure adding method such as a pump (liquid feeding pump, circulating pump, etc.), and specifically, a rotary pump, a diaphragm pump, a metering pump, a chemical pump, a plunger pump, a bellows pump, a gear pump, a vacuum pump, an air pump, a liquid pump, and the like. The hydraulic pressure may be, for example, the pressure applied to the polyimide-based resin porous membrane by the liquid when permeating the liquid through the polyimide-based resin porous membrane according to only gravity, but it is preferable that pressure is applied by the positive hydraulic pressure application method. As the gas used for pressurization, a gas which is inert or nonreactive with respect to the feed liquid is preferable, and specific examples thereof include nitrogen, a rare gas such as helium, argon, and the like. In the field of manufacturing electronic materials, particularly semiconductors and the like, pressurization is preferable. In that case, the side to collect the liquid permeating through the polyimide-based resin porous membrane may be atmospheric pressure that does not decompress, and as for pressurization, positive pressure of gas is preferred. In the pressurizing method, a valve such as a pressurizing valve, a pressurizing valve or a three-way valve may be used. The reduced pressure is for depressurizing the side (filtrate side) where the liquid permeating through the polyimide-based resin porous membrane is collected. For example, it may be depressurizing by a pump, but it is preferable to depressurize to vacuum. In the case of circulating or feeding a feed solution by a pump, usually the pump is disposed between a feed liquid tank (or circulation tank) and a polyimide-based resin porous film.

The pressurization may use both the hydraulic pressure and the positive pressure of gas. Further, the differential pressure may be a combination of pressurization and depressurization, for example, it may be use of both of hydraulic pressure and depressurizing, use of both of positive pressure and depressurizing of gas, and use of hydraulic pressure and positive pressure and depressurizing of gas. When a method of providing a differential pressure is combined, a combination of a hydraulic pressure and a positive pressure of gas, and a combination of a hydraulic pressure and a reduced pressure are preferable from the viewpoint of ease of manufacturing and the like. In the present invention, since the polyimide-based resin porous membrane is used, as a method of providing a differential pressure, for example, purification excellent in impurity removal performance can be performed even by one method such as positive pressure of gas.

By providing the differential pressure, the pressure difference applied to the front and back of the polyimide-based resin porous membrane may be set appropriately depending on the thickness, the porosity or the average pore diameter of the polyimide-based resin porous membrane to be used, or the desired purifying degree, the flow amount, the flow rate, the concentration or viscosity of the feed liquid or the like. For example, in the case of the so-called cross flow method (flowing the feed liquid parallel to the polyimide-based resin porous membrane), it is, for example, 3 MPa or less, in the case of a so-called dead end system (flowing the feed liquid so as to intersect the polyimide-based resin porous membrane), it is, for example, 1 MPa or less. The lower limit value is not particularly limited, and is, for example, 10 Pa.

In the liquid purification method of the present invention, when part or all of the liquid is permeated from one side of the polyimide-based resin porous membrane to the other side, when the liquid contains a solute, the feed solution may be appropriately diluted.

In the liquid purification method of the present invention, before the feed liquid is allowed to permeate through, a solution of an alcohol such as methanol, ethanol, isopropyl alcohol or the like or a ketone such as acetone, methyl ethyl ketone or the like, water, a solvent contained in the feed liquid, or a mixture thereof may be brought into contact with the polyimide-based resin porous membrane and passed so that the polyimide-based resin porous membrane is cleaned or is improved in wettability with respect to the feed liquid or for adjusting the surface energy of the polyimide-based resin porous membrane and the feed liquid. In the contact between the solution before permeating through the feed liquid and the polyimide-based resin porous membrane, the polyimide-based resin porous membrane may be impregnated or immersed in the solution. And the polyimide-based resin porous membrane may be brought into contact with the solution to allow the solution to infiltrate also into the pores inside the polyimide-based resin porous membrane, for example. The contact between the solution before permeating through the feed liquid and the polyimide-based resin porous membrane may be carried out by the differential pressure as described above, and may also be carried out under pressure, particularly in the case of penetrating the solution into the pores inside the polyimide-based resin porous membrane.

The polyimide-based resin porous membrane of the present invention contains polyimide and/or polyamideimide which may contain at least one selected from the group consisting of carboxy group, salt type carboxy group and —NH— bond as the main component. Since it is a porous membrane having a high degree of porosity as described above, it can be suitably used as a separating material and an adsorbing material. The polyimide-based resin porous membrane of the present invention is a porous membrane having interconnected pores, and is preferably a porous membrane having interconnected pores in which a pore having a curved inner surface is formed as described above, more preferably, since it is a porous membrane having interconnected pores including a structure in which substantially spherical pores are in communication with each other, when a liquid is allowed to permeate through the porous membrane, impurities including elements being solid at ordinary temperature and is contained in the liquid can be partially or entirely removed from the liquid.

In the present specification, "elements being solid at ordinary temperature" means elements constituting a simple substance which is solid at ordinary temperature, for example, at room temperature, specifically 20° C. For example, when the element is Fe, since iron as a simple substance of Fe element is solid at ordinary temperature, it corresponds to "elements being solid at ordinary temperature" in the present invention. "Elements being solid at ordinary temperature" usually include metal elements, metalloid elements, and some nonmetallic elements. Examples of the metal element include alkali metals such as Li, Na and K; alkaline earth metals such as Be, Mg, Ca, Ba and the like; transition metals belonging to Groups 3 to 11, such as Cr, Mn, Fe, Co, Ni, Cu and Zn of the periodic table; metals belonging to Groups 12 to 15 of the periodic table, such as Zn, Al, Ga, and Sn. Examples of metalloid elements include B, Si, Ge, As, Sb, Te, Po, and the like. Some nonmetallic elements include C, P, S, I and the like. In the present invention, the "elements being solid at ordinary temperature" are preferably a metal element or a metalloid element, more preferably a metallic element, and still more preferably iron and/or zinc.

In the present specification, "impurities including elements being solid at ordinary temperature" means impurities containing the "elements being solid at ordinary temperature", and may be a simple substance of the element, or may be a compound including a plurality of elements having the element.

The method of purifying a liquid of the present invention is particularly preferably applied when the impurity is a metal impurity containing a metal element, in view of high need for removal from a chemical solution or the like, for example, in the field of manufacturing electronic materials such as semiconductors. By using the polyimide-based resin porous membrane of the present invention, it is considered that a minute substance such as metal particles present in the liquid before treatment tends to adsorb to the pores and/or the communicating pores of the porous membrane. The polyimide-based resin porous membrane of the present invention may further have at least one selected from the group consisting of a carboxy group, a salt-type carboxy group and an —NH— bond. It is thought to be easy to aspire metal particles contained in the fluid, for example, metal ions or metal aggregates (for example, aggregates of metal oxides, aggregates of metals and organic substances) by the electric charge or Coulomb force provided in these groups, and to promote adsorbing to the pores in the porous membrane. Furthermore, it is considered that it can also function as an ion exchange membrane.

In the liquid purification method of the present invention, since the polyimide-based resin has a high degree of porosity and has interconnected pores as described above, it is considered that part or all of the impurities including elements being solid at ordinary temperature can be removed from the liquid before treatment by separation and/or adsorption. In the present specification, "separation" may include at least one selected from the group consisting of filtration, isolation, removal, trapping, purification and sieving, and can also be used for wastewater treatment. The method for purifying a liquid of the present invention can also be suitably used for processing that will perform both separation and adsorption as a process for separating a minute substance from a liquid containing the minute substance by adsorbing a minute substance to pores and/or communication pores and the like of the polyimide-based resin porous membrane.

As described above, the polyimide-based resin porous membrane of the present invention is a porous membrane containing pores preferably having an average pore diameter of several hundreds of nanometers, thus, for example, even minute substances in the nanometer unit, it can be adsorbed or trapped in pores and/or interconnected pores in the membrane. Therefore, the liquid purification method of the present invention using the polyimide-based resin porous membrane can be applied to electronic materials requiring extremely accurate impurity removal, particularly in the field of semiconductor manufacturing, for example, it can be suitably applied to various purification methods for separating and/or adsorbing impurities from various liquids such as a chemical solution or a cleaning solution to be used for semiconductor manufacturing. Such a chemical solution or cleaning solution is not particularly limited, but it is possible to remove, at a very high removal rate, impurities such as iron, zinc and the like contained in, for example, a chemical solution for forming a protective film for modifying a substrate, a chemical solution such as a cleaning solution of a silicon wafer, a chemical solution containing a photosensitive material such as a resist composition, and the chemical stock solution of the photosensitive material such as the resin solution.

In the method for purifying a liquid according to the present invention, the polyimide-based resin porous membrane can be used, for example, as a filter medium and other filtering materials, specifically, it can be used alone or as a filtering material to apply, and the other functional layer (membrane). Alternatively, it may be used as a membrane to be combined with another filter medium, for example, it may be used as a membrane for use in a filter device or the like. The functional layer that can be used in combination with the polyimide-based resin porous membrane of the present invention is not particularly limited, and examples thereof include nylon membranes, polytetrafluoroethylene (PTFE) membranes, tetrafluoroethylene/perfluoroalkylvinylether copolymer (PFA) films, membranes modified with them or the like having a chemical or physicochemical function.

In the method for purifying a liquid according to the present invention, the polyimide-based resin porous membrane may also be used for a filter medium such as a metal filter used in the field of semiconductor manufacturing, for example, and may also be used for a laminate including the filter medium and another filter material and can also be used suitably for a filter device. The filter device is not particularly limited, but in the filter device, the polyimide-based resin porous membrane is arranged so that the feed liquid and the filtrate cross each other. In relation to the liquid flow path, the porous membrane may be arranged in parallel to the flow path or may be arranged to intersect. Regions before and after passing the polyimide-based resin porous membrane are appropriately sealed so that the feed liquid is separated from the filtrate. For example, as a method of sealing, the polyimide-based resin porous membrane of the present invention may be adhered by light (UV) curing or adhesion by heat (including adhesion due to an anchor effect (thermal welding or the like)) or may be processed by adhering using an adhesive. Alternatively, the polyimide-based resin porous membrane of the present invention and another filter material (filter) can be adhered, for example, by an incorporation method or the like. The polyimide-based resin porous membrane may be further provided in an outer container made of a thermoplastic resin such as polyethylene, polypropylene, tetrafluoroethylene perfluoroalkylvinylether copolymer (PFA), polyethersulfone (PES), polyimide, polyamideimide or the like.

The filter medium in the third aspect of the present invention described above is a filter medium including a polyimide and/or polyamideimide porous membrane used for the method for purifying a liquid according to the present invention, and a filter device including a polyimide and/or polyamideimide porous membrane is also one of the present inventions.

The method for purifying a liquid of the present invention can be suitably used for removing metals contained in the above-mentioned chemical solution and the like used in the field of semiconductor manufacturing, and as metals, in particular, the removal rate of iron and zinc is high. The metal removal rate described below can be, for example, 90% or more, preferably 95% or more, more preferably 97% or more, still more preferably 98% or more with respect to iron, and for zinc, for example, 45% or more, preferably 50% or more, more preferably 60% or more, but for zinc contained in pure water, for example, it can be 80% or more, preferably 85% or more, more preferably 90% or more. In the case of using a polyimide-based resin porous membrane that has undergone an imide bonding ring-opening step, it can be set to, for example, 95% or more, preferably 98% or more. The upper limit of the metal removal rate is preferably as high as possible, but it is, not particularly set but for iron, for example, less than 100%, usually 99.5% or less when the liquid is an organic solvent and 99% or less when the liquid is pure water. For zinc, for example, it can be 100% or less, and in some cases it may be 99% or less.

In the method for purifying a liquid according to the present invention, when the polyimide-based resin porous body of the present invention is used for removing impurities such as metals contained in the above-mentioned chemical solution and the like used in the semiconductor manufacturing field, the polyimide-based resin porous membrane is preferably subjected to impurity removal treatment keeping high flow ratio of the chemical solution. In this case, the flow rate is not particularly limited, and the flow rate of pure water pressurized at 0.08 MPa at room temperature may be 1 ml/min or more, preferably 3 ml/min or more, more preferably 5 ml/min or more, particularly preferably 10 ml/min or more. The upper limit is not particularly limited, and may be, for example, 50 ml/min. The method for purifying a liquid according to the present invention is advantageous in that the impurity removal rate can be kept high while maintaining a high flow rate.

The method for purifying a liquid of the present invention uses a polyimide-based resin porous membrane containing polyimide and/or polyamideimide as a main component, so that it is possible to maintain a high flow rate of a fluid such as a chemical solution. Further, it is suitably applied to circulation type purifying which permeates through the polyimide-based resin porous membrane while constantly circulating it. The polyimide-based resin porous membrane of the present invention is also excellent in mechanical properties such as stress resistance and fracture elongation. For example, the stress resistance is preferably 10 MPa or more, more preferably 15 MPa or more, still more preferably 15 to 50 MPa, and the fracture elongation may be, for example, 10% GL or more, preferably 15% GL or more. The upper limit of the fracture elongation can be, for example, 50% GL, preferably 45% GL, more preferably 40% GL. When the porosity is lowered, the fracture elongation tends to be increased.

[Method for Producing Chemical Solution or Cleaning Solution]

A second aspect of the present invention is a method for producing a chemical solution or a cleaning solution, and uses the method for purifying a liquid according to the first aspect of the present invention. Since the method for purifying a liquid according to the first aspect of the present invention is a method having an excellent purification effect as described above, in the producing method according to the second embodiment of the present invention, using such a method for purifying a liquid, it is possible to produce a chemical solution or a cleaning solution whose amount is reduced.

EXAMPLES

The present invention will be described more specifically with reference to Examples. However, the scope of the present invention is not limited to these Examples.

In the Examples and Comparative Examples, the following tetracarboxylic acid dianhydride, diamine, polyamide acid, polyamide imide, organic solvent, dispersant and fine particles were used. The particle size distribution index (d25/75) of silica (1) is about 3.3, and the particle size distribution index (d25/75) of silica (2) is about 1.5.

Tetracarboxylic dianhydride: pyromellitic dianhydride
Diamine: 4,4'-diaminodiphenyl ether
Polyamide acid solution: reaction product of pyromellitic acid dianhydride and 4,4'-diaminodiphenyl ether (solid content: 21.9% by mass (organic solvent: N,N-dimethylacetamide))
Organic solvent (1): N, N-dimethylacetamide (DMAc)
Organic solvent (2): Gamma butyrolactone
Dispersant: polyoxyethylene secondary alkyl ether-based dispersant
Fine particles: silica (1): silica having an average particle size of 700 nm
Silica (2): silica having an average particle size of 300 nm
Etching solution (1):
A 1.1% by mass solution of NaOH in a mixed solution composed of methanol:water (mass ratio 3:7)
Etching solution (2):
A 1.0% by mass solution of tetramethyl ammonium (TMAH) in a mixed solution composed of methanol:water (mass ratio 4:6)

<Examples 1 to 4> Polyimide Porous Membrane

[Preparation of Silica Dispersion Liquid]

23.1 parts by mass of silica (1) or silica (2) having an average particle size specified in Table 1 was added to a mixture of 23.1 parts by mass of the organic solvent (1) and 0.1 part by mass of the dispersing agent, and the mixture was stirred to prepare a silica dispersion liquid.

[Preparation of Varnish]

42.0 parts by mass of the silica dispersion liquid obtained in Preparation 1 of the silica dispersion liquid was added to 41.1 parts by mass of the polyamide acid solution. Further, the organic solvents (1) and (2) were added so that the solvent composition of the entire varnish was organic solvent (1): organic solvent (2)=90:10, and the mixture was stirred to prepare a varnish. In the obtained varnish, the volume ratio between the polyamide acid and silica is 40:60 (mass ratio is 30:70).

[Film Formation of Unburned Composite Membrane]

The above varnish was formed as a base material on a polyethylene terephthalate (PET) film using an applicator. The film was prebaked at 90° C. for 5 minutes to prepare an unburned composite (unburned composite film) having a film thickness of 40 μm. After dipping in water for 3 minutes, the unburned composite membrane was pressed through between two rolls. At that time, the roll restraining pressure was 3.0 kg/cm², the roll temperature was 80° C., and the moving speed of the unburned composite film was 0.5 m/min. The unburned composite membrane was released from the substrate to obtain an unburned composite membrane.

[Imidization of Unburned Composite Membrane]

The unburned composite membrane was heat-treated (burned) for 15 minutes at a temperature specified in Table 1 for imidization to obtain a polyimide-fine particle composite membrane.

[Formation of Polyimide Porous Membrane]

The polyimide-fine particle composite membrane obtained above was dipped in a 10% HF solution for 10 minutes to remove fine particles contained in the membrane, followed by cleaning with water and drying to obtain a polyimide porous membrane.

[Chemical Etching]

In Examples 1 and 2, a polyimide porous membrane was dipped in a chemical etching solution (1) for 2 minutes as an imide bond ring-opening process, and imidization ring-opening process was performed to obtain a polyimide porous membrane. Thereafter, re-burning was carried out at the temperature and time shown in Table 1. In Examples 3 and 4, chemical etching as an imide bond ring-opening step and subsequent re-burning were not carried out.

<Comparative Examples 1 to 2> Porous Membrane of Other Resin

A porous membrane made of polyamide (nylon) (pore size: about 10 nm or less, film thickness about 75 μm) as Comparative Example 1 and a polyethylene porous membrane (pore size: about 10 nm or less, film thickness about 50 μm) as Comparative Example 2 were provided.

<Evaluation>

For the porous membranes provided above, the following evaluation was carried out respectively.

[Imidization Ratio]

For the porous film subjected to the chemical etching treatment as the imide bond ring-opening step, the porous film was re-burned at the temperature specified in Table 1 for 15 minutes. Thereafter, a value (the above X2) was determined by dividing the area of a peak representing the imide bond measured by the Fourier transform infrared spectroscopy (FT-IR) apparatus by the area of a peak representing benzene measured also by the FT-IR apparatus. A value (the above X1) measured for a porous membrane prepared from the same varnish used in each of the porous membranes (a membrane for which the imidization reaction was substantially completed and the chemical etching treatment was not carried out) was determined, and the unconversion rate (%) was determined. The unconversion rates and X2 values were summarized in Table 1.

[Stress Resistance and Fracture Elongation]

Each porous membrane was cut into a size of 3 cm×3 mm to obtain a rectangular sample. The stress at break (MPa; tensile strength) and fracture elongation (% GL) of this sample were evaluated using EZ Test (manufactured by Shimadzu Corporation). The results are summarized in Table 1.

[Metal Removal Rate and Flow Rate]

Each prepared porous membrane was cut into a circle having a diameter of 47 mm and used as a filter material. After housing setting, 200 mL of isopropyl alcohol was passed therethrough. Thereafter, the metal impurity-containing liquid prepared by adding iron and zinc to pure water (DIW) or propylene glycol monomethyl ether (PGME) was measured for each content (A) of iron and zinc in the liquid, then while flowing under nitrogen pressure at 0.08 MPa, the time taken for passing each metal impurity-containing liquid was measured to determine the flow rate (ml/min). The results are summarized in Table 1. Each of content (B) of iron and zinc in the liquid after passing was measured, and the value represented by the following formula was taken as the metal removal rate (%) and evaluated according to the following criteria. The results are summarized in Table 1.

$$(A-B)/B \times 100$$

However, since the membrane was broken at 0.08 MPa and the metal removal rate could not be calculated in the porous membrane made of polyethylene, the metal removal rate (%) at the time of passing under nitrogen pressurization at 0.04 MPa was taken as a reference value.

[Gurley Air Permeability]

For each of the above porous membranes, a sample having a thickness of about 40 μm was cut into 5 cm squares. The time for 100 ml of air to pass through the sample was measured with a Gurley densometer (manufactured by Toyo Seiki Seisaku-Sho, Ltd.), according to JIS P 8117. The results are summarized in Table 1.

[Solvent Resistance]

Test pieces of the same polyimide porous membrane as in Examples 1 to 4 were prepared and the influence after dipping in butyl acetate and cyclohexanone at room temperature for 24 hours was confirmed. Specifically, the rate of decrease in tensile strength after dipping when the tensile strength before dipping was taken as 100% was determined. The tensile strength was measured in the same manner as the method of measuring the stress at break. It could be confirmed that the decreasing rate of the tensile strength was less than 1% in any solvents and there was almost no influence by the solvent.

TABLE 1

| | Resin | Particles (Average particle size/nm) | Membrane thickness | Burning (15 min) | CE | Re-burning (15 min) | Air permeability (Sec) | Flow rate (DIW) (ml/min) |
|---|---|---|---|---|---|---|---|---|
| Example 1 | Polyimide | 700 | 40 μm | 340° C. | Done | 340° C. | 90.5 | 25 |
| Example 2 | | 300 | 40 μm | 340° C. | Done | 340° C. | 161.1 | 11.5 |
| Example 3 | | 700 | 40 μm | 340° C. | Not done | — | 310.0 | 7.1 |
| Example 4 | | 300 | 40 μm | 340° C. | Not done | — | 321.6 | 5.9 |
| Comparative Example 1 | Polyamide | — | 75 μm | — | — | — | — | 5.5 |
| Comparative Example 2 | Polyethylene | — | 50 μm | — | — | — | — | 8.1 |

| | Flow rate (PGME) (ml/min) | Stress (MPa) | Fracture elongation (% GL) | Imidization ratio of X2 (Unconversion rate) (%) | Metal removal rate DIW Fe(%) | DIW Zn(%) | PGME Fe(%) |
|---|---|---|---|---|---|---|---|
| Example 1 | 16.6 | 17.2 | 30.1 | 1.43 (93.04) | 98.60 | 100 | 99.06 |
| Example 2 | 6.3 | 16.5 | 36.4 | 1.43 (93.04) | 98.03 | 99.78 | 99.14 |
| Example 3 | 4.8 | 22.1 | 27.5 | 1.54 | 94.61 | 87.56 | 98.16 |
| Example 4 | 3.3 | 18.2 | 38.6 | 1.54 | 89.05 | 91.60 | 99.16 |
| Comparative Example 1 | 16.6 | — | — | — | 0 | 0 | 23.71 |
| Comparative Example 2 | 2 | — | — | — | (47.0) | (15.8) | (98.83) |

From Table 1, it was found that each of the Examples is, in essence, superior to the Comparative Examples in the metal removal rate, and in particular, it is far superior to Comparative Example 1 where the nylon porous membrane was used. In addition, in each example, the metal removal rate was equal to or higher than the metal removal rate of the polyethylene porous film of Comparative Example 2 in which the pressurizing condition was lowered, it was also confirmed that the membrane had a high metal removal rate. In each of the Examples, the flow rate was equal to or higher than that of the Comparative Example 1 in the DIW and the flow rate was higher than that in the Comparative Example 2 in the PGME, and it was confirmed that the flow rate range was applicable to both the aqueous system and the solvent system. Since each of the Examples has a high removal rate and a proper flow rate with a smaller film thickness than the Comparative Example, when a polyimide-based resin porous membrane is used for a filter medium or a filter device, it is possible to miniaturize the device, and even when processing the porous polyimide-based resin membrane into a fold shape, it can be folded many times, so it is possible to prepare a filter device having higher removal performance. From Example 1 and Example 2 and Example 3 and Example 4, it was found that chemical etching as an imide bond ring-opening step improved metal removal rate in pure water and PGME.

In the case of pure water, the metal removal rate of each Example was almost equal to Fe and Zn, but when performing chemical etching as an imide bond ring-opening step, Zn was slightly higher than Fe. Conversely, it was found that Fe was slightly higher than Zn when chemical etching as imide bond ring-opening step was not performed. From Example 1 and Example 3 and from Example 2 and Example 4, when the imidization ratio was lowered by chemical etching as an imide bond ring-opening step, while maintaining the metal removal rate (adsorption rate) well, it became possible to improve the flow rate.

In Comparative Example 1 using a nylon porous membrane, the flow rate in PGME could be increased particularly, but the metal removal rate was found to be much lower. In Comparative Example 2 using a polyethylene porous membrane, the membrane was broken at 0.08 MPa nitrogen pressurization as described above with respect to [flow rate], so that the metal removal rate of Fe in PGME shown in Table 1 was set under nitrogen pressure of 0.04 MPa, the flow rate became further slower than 2 ml/min, which was an advantageous condition than the respective examples conducted at other fast flow rates due to such a slow flow rate, and it is inferred the removal of Fe was advanced. As described above, it was found that it was impossible to achieve both high flow rate and high metal removal rate in Comparative Example 1 using the conventional nylon porous membrane and Comparative Example 2 using the polyethylene porous membrane.

In addition, from the solvent resistance test, it was confirmed that the polyimide porous membrane was resistant to butyl acetate and cyclohexanone. In general, butyl acetate is not used for polyethylene type filters, and use of cyclohexanone in polyethylene type filters and nylon type filters is avoided. Accordingly, there is a possibility that, when these solvents are purified, the polyimide porous membrane can be applied as filter media.

Example 5

A filter device having the same polyimide porous membrane as in Example 2 was prepared.

Example 6

A polyimide porous membrane was obtained in the same manner as in Example 2, except that the etching solution (3) was used as the chemical etching solution. The imidization ratio of the above X2 of the obtained polyimide porous membrane was 1.51. The Gurley air permeability was 230 seconds. A filter device including the polyimide porous membrane was provided.

Comparative Example 3

A filter device (Dispo, manufactured by Pall Corporation) having a porous membrane made of polyamide (nylon) (pore size: about 20 nm) was provided.

<Evaluation>

With respect to each filter device prepared according to Examples 5 and 6 and Comparative Example 3, the following evaluation was carried out using the object to be passed specified in Table 2.

[Metal Removal Rate]

The following resin solution and chemically amplified resist composition were prepared and the metal removal rate was evaluated. The metal removal rate was obtained by the same formula as the evaluation of the metal removal rate. The iron content of the resin solution or chemically amplified resist composition before passing through was defined as (A) and the amount of iron impurities in the liquid after passing through each of the prepared filter devices was regarded as (B). In all cases, filtration conditions were set at a filtration pressure of 1.0 kgf/cm² (9.8 N/cm²) at room temperature.

Resin solutions (1) to (3)

4 mass % resin solutions prepared by dissolving each of propylene glycol monomethyl ether acetate:propylene glycol monomethyl ether=60:40 (mass ratio).

Polymer compound (1)

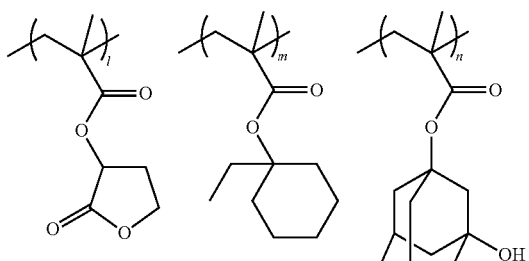

[Mw: 7000, l:m:n = 40:40:20 (molar ratio)]

Polymer compound (2)

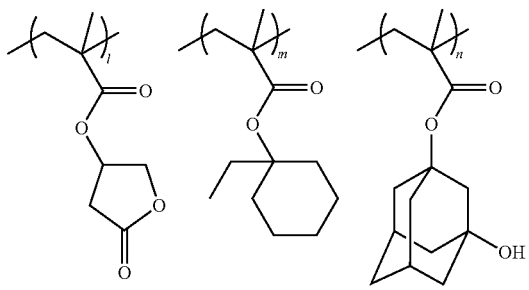

[Mw: 7000, l:m:n = 40:40:20 (molar ratio)]

Polymer compound (3)

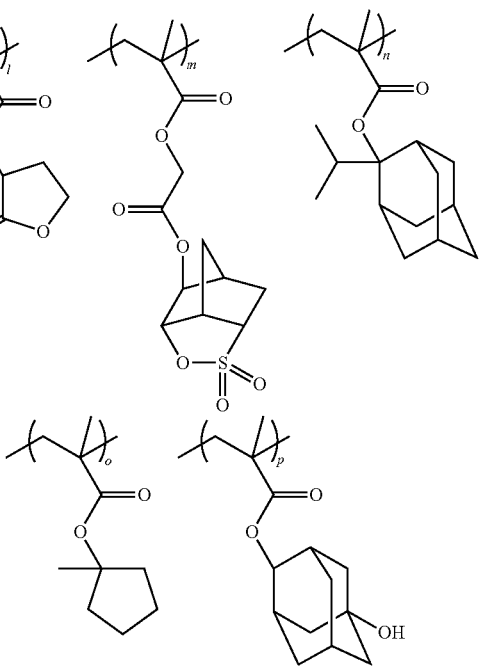

[Mw: 7000, l:m:n:o:p = 35:27:18:13:7 (molar ratio)]

Chemically Amplified Resist Composition (1)

100 parts by mass of the polymer compound (1), 3.6 parts by mass of the following acid generator (1) and 0.4 parts by mass of tri-n-octylamine were mixed with a mixed solvent composed of propylene glycol monomethyl ether acetate: propylene glycol monomethyl ether=60:40 (mass ratio) to regulate the solid content so that the solid content concentration of the polymer compound (1) was about 7%, thereby obtaining a chemically amplified resist composition (hereinafter referred to as "resist (1)").

(1)

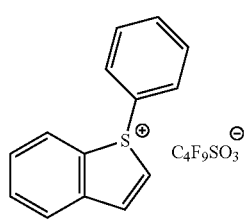

Acid generator

TABLE 2

| | Filter device | Liquid passed | Metal removal rate (%) |
|---|---|---|---|
| Example 5-1 | Example 5 | Resin solution (1) | 100 |
| Comparative Example 3-1 | Comparative Example 3 | Resin solution (1) | 79.2 |
| Example 5-2 | Example 5 | Resist (1) | 97.5 |
| Comparative Example 3-2 | Comparative Example 3 | Resist (1) | 80.5 |

TABLE 2-continued

| | Filter device | Liquid passed | Metal removal rate (%) |
|---|---|---|---|
| Example 6-1 | Example 6 | Resin solution (2) | 65.8 |
| Comparative Example 3-3 | Comparative Example 3 | Resin solution (2) | 35.8 |
| Example 6-2 | Example 6 | Resin solution (3) | 67.9 |
| Comparative Example 3-4 | Comparative Example 3 | Resin solution (3) | 14.7 |

It was found from Table 2 that, in each of the Examples, the metal removal rate was far superior to that of the Comparative Examples even when the object to be passed was a resin solution or a resist composition.

The invention claimed is:

1. A method for purifying a liquid, the method comprising:
 allowing the liquid to be permeated through from one side to the other side of a polyimide and/or polyamideimide porous membrane having pores and interconnected pores by way of a differential pressure, so that the liquid, in a liquid state, is permeated through the porous membrane,
 wherein the interconnected pores open to an external surface of the one side of the porous membrane, are interconnected inside the porous membrane, and are also open to an external surface of the other side of the porous membrane, and
 the pores in the porous membrane consist essentially of substantially spherical pores having an average spherical diameter of 50 to 2,000 nm, and individual pores thereof are connected to one another over the whole of the membrane to form a flow path for a liquid to be purified.

2. The method according to claim 1, further comprising removing impurities contained in the liquid from the liquid by way of the porous membrane, the impurities comprising an element being solid at ordinary temperature.

3. The method according to claim 1, wherein the differential pressure is applied by utilizing at least one selected from the group consisting of hydraulic pressure, vacuum, and positive pressure from inert gas or nonreactive gas.

4. The method according to claim 1, wherein the interconnected pores comprise interconnected pores having a pore diameter of 1 to 200 nm.

5. The method according to claim 1, wherein the substantially spherical pores further have concaves in an inner surface thereof.

6. The method according to according to claim 1, wherein the liquid is a chemical solution or a cleaning solution for manufacturing a semiconductor.

7. The method according to claim 1, wherein the polyimide and/or polyamideimide porous membrane is comprised of a filter medium.

8. The method according to claim 1, wherein the polyimide and/or polyamideimide porous membrane is comprised of a filter device.

9. The method for according to claim 1, wherein the differential pressure is 10 Pa or more and 3 MPa or less.

10. The method according to claim 1, wherein the method is performed at room temperature.

11. The method according to claim 1, wherein the interconnected pores have a pore diameter of 1 to 200 nm.

12. A method for manufacturing a chemical solution or a cleaning solution, the method comprising purifying a liquid containing impurities by the method according to claim 1.

* * * * *